US008224134B2

(12) United States Patent
Baeyens et al.

(10) Patent No.: US 8,224,134 B2
(45) Date of Patent: Jul. 17, 2012

(54) OPTOELECTRONIC RECEIVER (75) Inventors: Yves Baeyens, Stirling, NJ (US); Young-Kai Chen, Berkeley Heights, NJ (US); Vincent Houtsma, New Providence, NJ (US); Andreas Leven, Heroldsberg (GE); Nils Guenter Weimann, Gillette, NJ (US)

(73) Assignee: Alcatel-Lucent USA Inc., Murray-Hill, NJ (US)

( * ) Notice: Subject to any disclaimer, the term of this patent is extended or adjusted under 35 U.S.C. 154(b) by 226 days.

(21) Appl. No.: 12/418,442

(22) Filed: Apr. 3, 2009

(65) Prior Publication Data
US 2010/0254651 A1    Oct. 7, 2010

(51) Int. Cl.
G02B 6/12 (2006.01)
G02B 6/28 (2006.01)
H04B 10/06 (2006.01)

(52) U.S. Cl. .................. 385/14; 385/24; 398/214
(58) Field of Classification Search .............. 385/14, 385/24; 398/214
See application file for complete search history.

(56) References Cited

U.S. PATENT DOCUMENTS

| 6,538,785 | B1 * | 3/2003 | Kim et al. | 398/140 |
|---|---|---|---|---|
| 6,704,480 | B2 * | 3/2004 | Worchesky et al. | 385/37 |
| 6,885,792 | B2 * | 4/2005 | Eggleton et al. | 385/37 |
| 7,366,368 | B2 * | 4/2008 | Morrow et al. | 385/15 |
| 7,676,124 | B2 * | 3/2010 | Heinz-Gunter | 385/14 |
| 7,720,389 | B2 * | 5/2010 | Yokoyama | 398/139 |
| 7,907,847 | B2 * | 3/2011 | Tanushi et al. | 398/139 |
| 2002/0039465 | A1 * | 4/2002 | Skinner | 385/15 |
| 2002/0041734 | A1 * | 4/2002 | Worchesky et al. | 385/37 |
| 2003/0087466 | A1 * | 5/2003 | Wang et al. | 438/45 |
| 2004/0014508 | A1 | 1/2004 | Chen | |
| 2004/0052445 | A1 * | 3/2004 | Forrest et al. | 385/14 |
| 2004/0120648 | A1 * | 6/2004 | Kwon et al. | 385/43 |
| 2005/0110108 | A1 * | 5/2005 | Patel et al. | 257/453 |
| 2007/0014508 | A1 * | 1/2007 | Chen et al. | 385/14 |
| 2009/0304390 | A1 * | 12/2009 | Tanushi et al. | 398/139 |
| 2010/0028011 | A1 * | 2/2010 | Kaneda et al. | 398/115 |
| 2010/0166427 | A1 * | 7/2010 | Jeong | 398/82 |
| 2011/0042553 | A1 * | 2/2011 | Masini et al. | 250/214 A |

OTHER PUBLICATIONS

Houston P A et al; "In/P/InGaAs Heterojunction Phototransistors for Optoelctronic Receivers"; Semiconductor Electronics, 2004, ICSE 2004; IEEE International Converence on, IEEE, Piscataway, NJ USA LNKD-DOE:10.1109/SMELEC.2004.162081, Dec. 7, 2004, pp. A1-A5, XP010910225, ISBN;978-0-7803-8658-7; The Whole Document.
Unlu M S et al; "Wavelength Demultiplexing Heterojunction Phototransistor"; Electronics Letters, IEE Stevenage, GB, vol. 26, No. 22, Oct. 25, 1990, pp. 1857-1858, XP000109914, ISSN: 0013-5194; The Whole Document.
Charles L Goldsmith et al: "Principles and Performance of Traveling-Wave Photodetector Arrays"; IEEE Transactions on Microwave Theory and Techniques, IEEE Service Center, Piscataway, NJ, US, vol. 45, No. 8, Aug. 1, 1997, XP011036903, ISSN: 0018-9480, The Whole Document.

* cited by examiner

Primary Examiner — Rhonda Peace
(74) Attorney, Agent, or Firm — Brosemer, Kolefas & Associates (57) ABSTRACT An optoelectronic receiver and associated method of operation.

15 Claims, 8 Drawing Sheets

OPTOELECTRONIC RECEIVER

FIELD OF DISCLOSURE

This disclosure relates generally to the field of optical communications and in particular to optoelectronic receivers.

BACKGROUND OF DISCLOSURE

Optoelectronic receivers are an essential component of contemporary optical communications systems and a variety of types have been developed and deployed. Of these types, optoelectronic receivers which employ avalanche photo detector (APD) technologies generally exhibit high sensitivity but poor power-handling capabilities. Optoelectronic receivers which employ pin photo detector technologies typically require an optical pre-amplifier or electronic amplifier to boost input signal levels which unfortunately generates noise and signal delays.

SUMMARY OF DISCLOSURE

An advance is made in the art by an integrated InP heterojunction phototransistor-amplifier (HPT-amplifier) optoelectronic receiver and associated methods.

BRIEF DESCRIPTION OF THE DRAWING

A more complete understanding of the disclosure may be realized by reference to the accompanying drawing in which.

DESCRIPTION OF EMBODIMENTS

The following merely illustrates the principles of the various embodiments. It will thus be appreciated that those skilled in the art will be able to devise various arrangements which, although not explicitly described or shown herein, embody the principles of the embodiments and are included within their spirit and scope.

Furthermore, all examples and conditional language recited herein are principally intended expressly to be only for pedagogical purposes to aid the reader in understanding the principles of the embodiments and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures depicting the principles of the embodiments.

Figure 1:
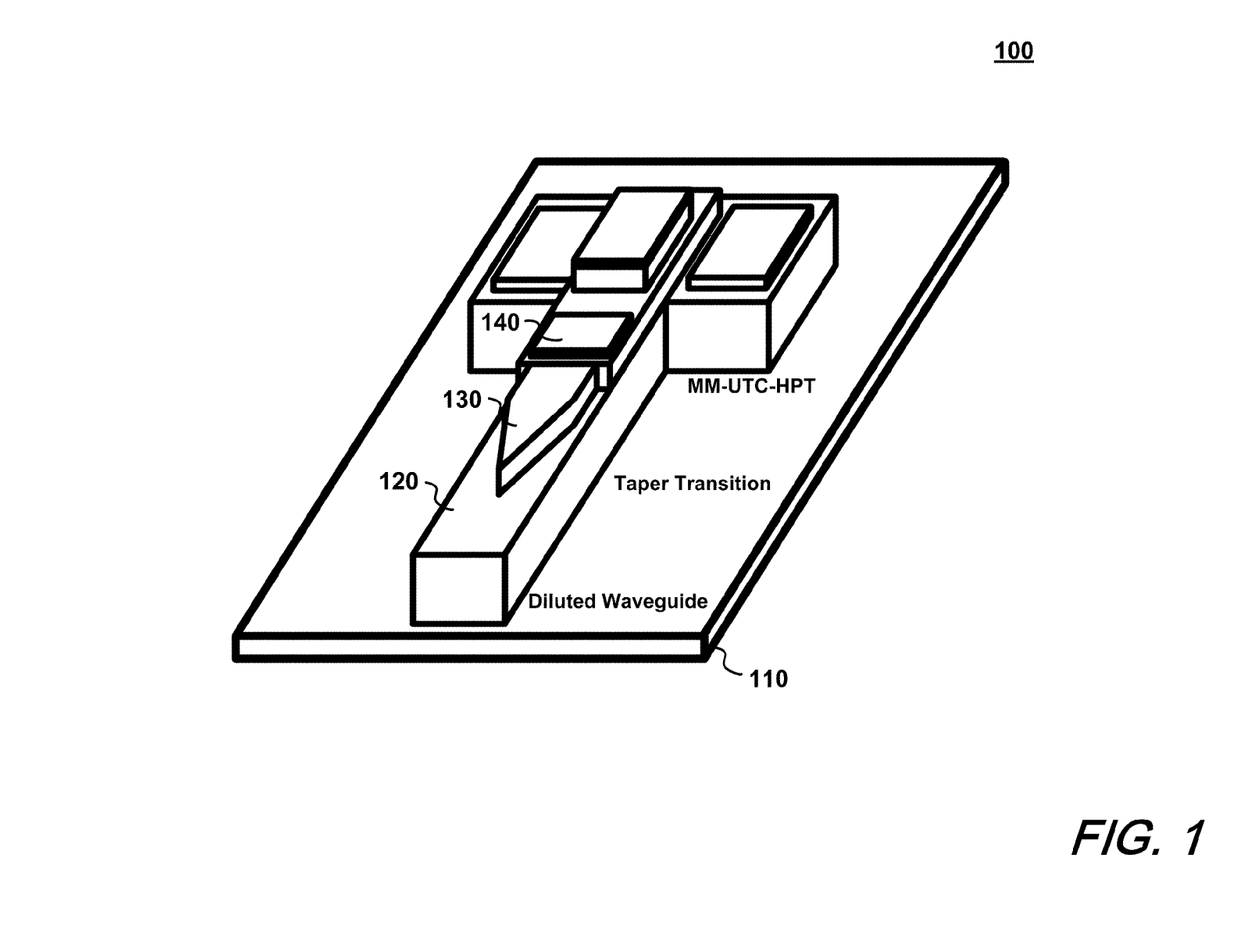
FIG. 1 is a perspective view of a simplified schematic diagram of an integrated traveling-wave uni-travel-carrier heterojunction phototransistor (TW-UTC-HPT) according to an aspect of the present disclosure.

Turning now to FIG. 1 there is shown a perspective view of a simplified integrated multi-mode uni-travel carrier heterojunction photo-transistor (MM-UTC-HPT) assembly 100 according to an aspect of the disclosure. More specifically, the MM-UTC-HPT assembly includes a substrate 110 onto which is integrated a diluted waveguide 120 which directs received optical signals (not specifically shown) into a tapered transition region 130 for reception and detection by a MM-UTC-HPT 140.

In this embodiment shown, the base-collector junction of the HPT employs a uni-carrier design using a thin waveguide base region to detect optical signals and uses electron carriers for amplification and transport of detected optical signals. The diluted waveguide 120 and spot-size converter are integrated with the HPT thereby enhancing coupling efficiency to an optical fiber (not specifically shown) while delivering high optical power with low guiding loss. As will be described, mm-wave high power optoelectronic receivers may advantageously be produced when MM-UTC-HPTs are integrated with other high-speed HBTs.

Uni-Travel-Carrier photodiodes—as generally employed in embodiments according to the present disclosure—may utilize a very thin p+ absorption region in a reversed-biased photodiode in which photo-generated holes as majority carriers respond very fast within dielectric relaxation time, while photo-generated electrons drift quickly through thick depletion regions. Advantageously, UTC photodiodes exhibit a high cut-off frequency up to 325 GHz while accepting very high power optical signals. (See, for example, T. Ishibaashi et al., "Uni-traveling-carrier photodiodes", *Tech. Dig. Ultrafast Electronics and Optoelectronics* " Opt. Soc. Amer., Washington, D.C., 166-168, 1997; Ito et al., "InP/InGaAs Uni-Traveling-Carrier Photodiode with 310 GHz Bandwidth", *Electronics Letters*, v.36, pp. 1809-1810, 12 Oct. 2000).

Figure 2:
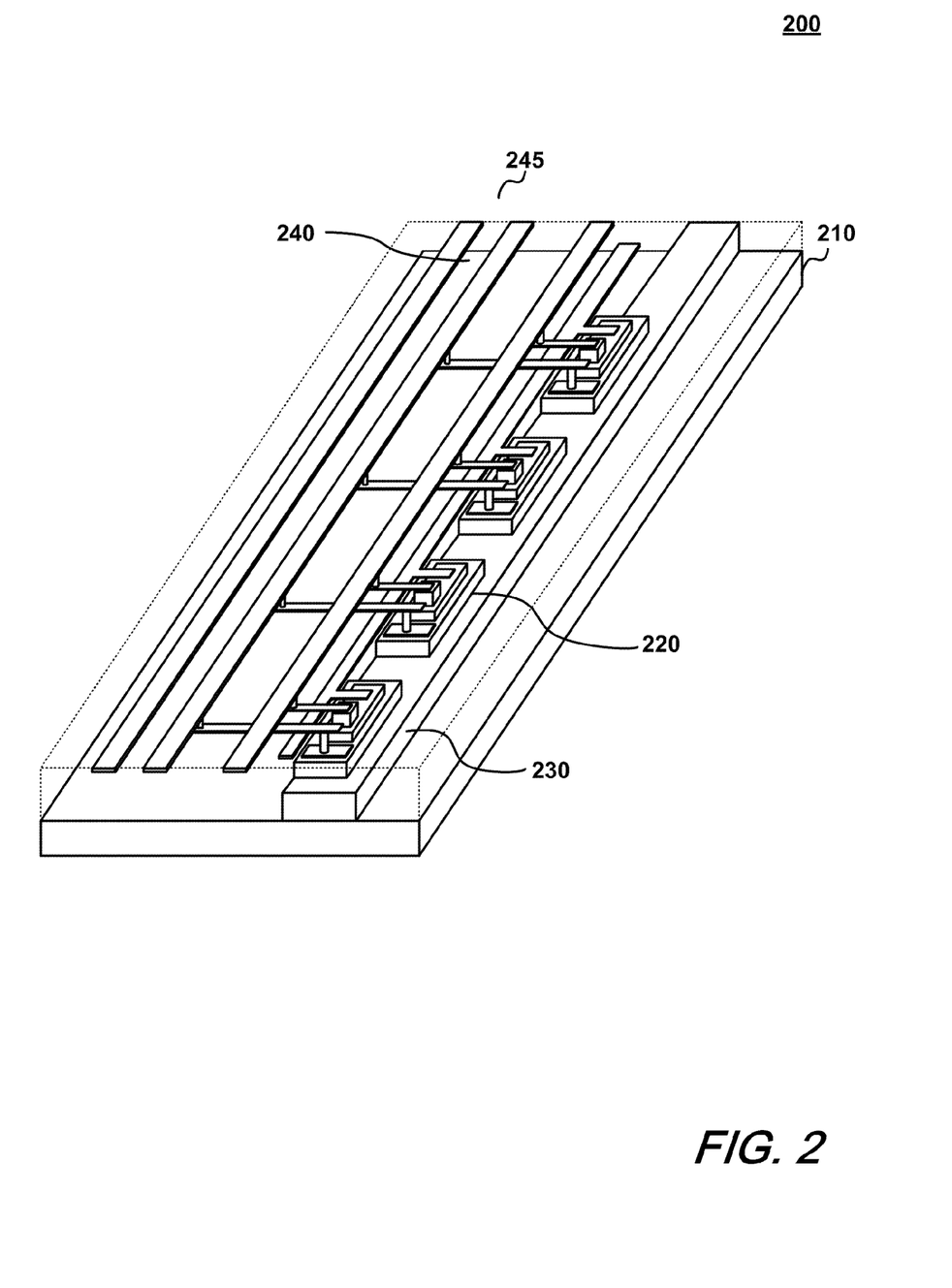
FIG. 2 is a simplified schematic of an InP UTC-HPT Receiver optoelectronic integrated circuit (OEIC) according to an aspect of the present disclosure.

Turning now to FIG. 2 there is shown a schematic diagram of a simplified InP UTC-HPT Receiver optoelectronic integrated circuit (OEIC) 200. The receiver 200 is fabricated onto an InP substrate 210 integrating both uni-traveling carrier photodiodes with high frequency DHBT transistors 220 advantageously resulting in a receiver exhibiting broadband detection-amplification characteristics. A diluted waveguide 230 provides direct coupling of received optical signals (not shown) into the photo-HBTs which may thereby minimize losses.

While not specifically shown in FIG. 2, the base-collector junction of the HPT uses a thin base region for detection of optical signals while fast electrons are used as charge carriers to transport detected optical signals and high speed amplification. Operationally, the low loss InP waveguide 230—integrated within the OEIC—distributes optical power (with appropriate delays) to multiple HPT's 220 contained within the structure. Multiple amplifier stages comprising the UTC-HPT and HBTs are integrated with a mm-wave coplanar transmission line 240. The transmission line 240 collects any detected and amplified electrical signals produced at each stage and coherently combines them into an electrical signal output to broadband electrical output port 245.

As compared with conventional hybrid integration of high power UTC detectors, the integrated UTC-HPT according to the present embodiment may advantageously reduce and/or eliminate lossy high-frequency interconnects of RF cabling and bond wires. In addition, the single chip implementation—as already noted—provides superior gain at mm-wave frequencies as light is delivered into the intrinsic base absorption region through the integrated InP optical waveguide 230. Guided light traversing the waveguide 230 produces photocurrent directly in the base region of the HPT 220, bypassing high base spreading resistance in the transistor. As a result, high frequency performance at mm-wave frequencies is realized.

At this point, a number of features of the OEIC shown in FIG. 2 may be appreciated by those skilled in the art. More particularly, with conventional discrete waveguide photodiode(s), the distribution of photo-generated carriers oftentimes follows an exponential decay profile along an absorption layer that leads to a high density of photo-generated carriers at the waveguide front end. To facilitate high power operation, the distributed waveguide approach described herein advantageously distributes the absorption along a length of the waveguide. In a preferred embodiment, the optical absorption is distributed among a number of UTC-HPTs coupled to the embedded low loss waveguide. In this configuration, a high input optical power may be more efficiently absorbed by the distributed UTC-HPTs.

Figure 3:
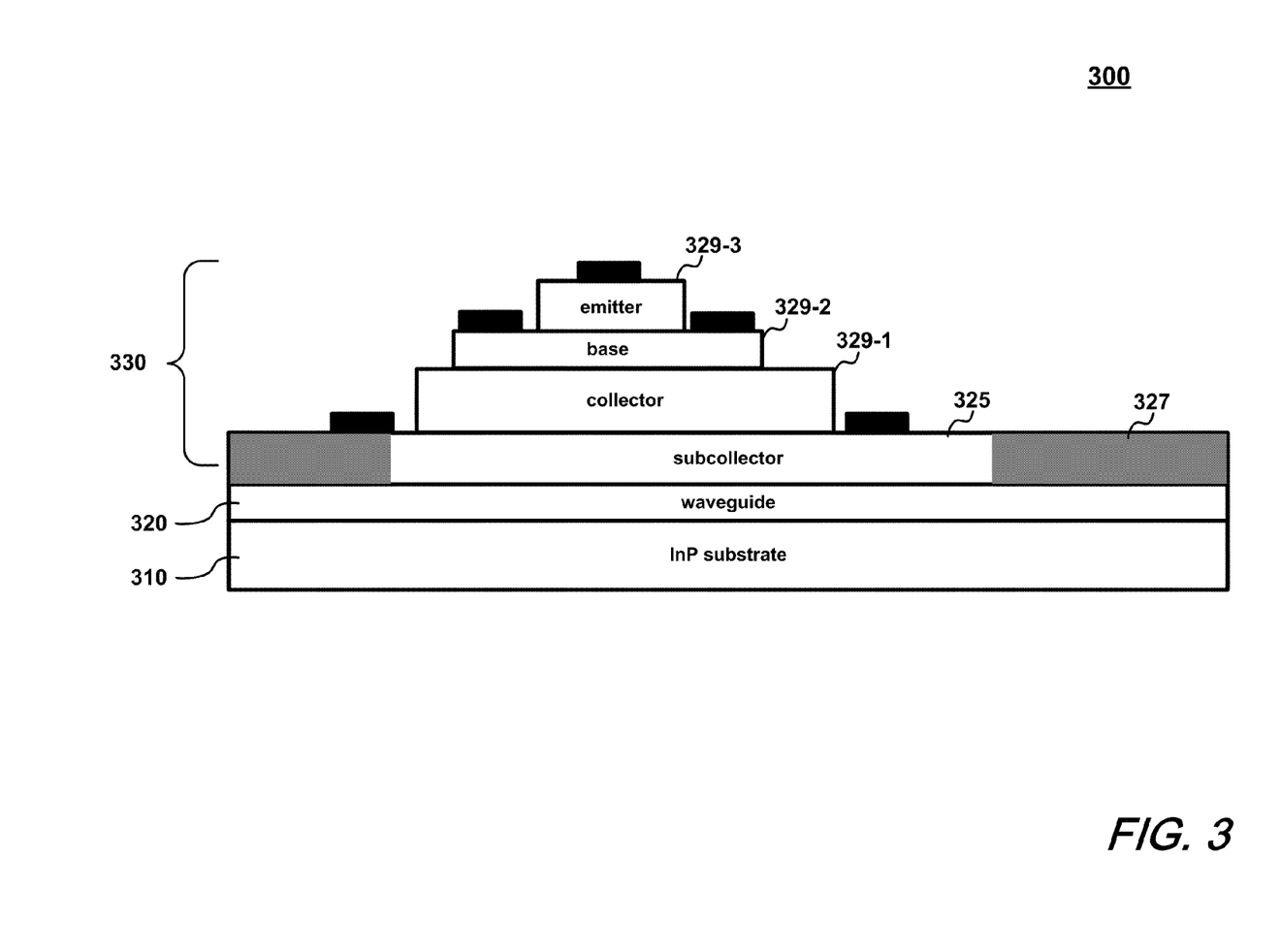
FIG. 3 is a cross-sectional schematic of an exemplary HPT with underlying waveguide according to an aspect of the present disclosure.

Turning now to FIG. 3, there is shown a schematic cross section of a representative HPT with underlying optical waveguide according to an aspect of the present embodiment which may be advantageously employed in the OIEC. More specifically, the HPT 300 in this example includes a semi-insulating InP single crystal substrate 310, an InGaAlAs waveguide 320 disposed upon the substrate 310 and an NPN heterojunction bipolar transistor (HPT) 330 comprising a collector 329-1, a base 329-2, and an emitter 329-3, disposed upon a waveguide sub-collector 325. The compositions and their functions are shown in their respective layers in the structure of FIG. 3.

Those skilled in the art will appreciate that one exemplary approach to the fabrication of structures employed according to the present disclosure involves a deep etched mesa waveguide for distributing light to the individual phototransistors. In the schematic cross section of FIG. 3, the waveguide core may be a ~200 nm thick InGaAlAs layer having an absorption edge of about 1.3 μm.

Advantageously, cladding may be formed by InP layers. As shown in FIG. 3, the InP substrate 310 forms a lower cladding, while an extended InP sub-collector 325 forms an upper cladding. To provide electrical isolation and to reduce any free-carrier absorption in the waveguide 320, n-doping in the extended InP subcollector 325 may be neutralized by implant isolation regions 327.

While various thickness(s) of the particular layers shown in FIG. 3 are possible, it will be readily understood by those skilled in the art that the thickness of the waveguide core determines the lateral confinement as well as index and that the thickness of the collector 329 will be tailored for sufficient coupling to the InGaAs absorption layer (not specifically shown in FIG. 3) such that any disturbances elsewhere in the waveguide are reduced—as the individual waveguide provides optical input to multiple phototransistors.

As may now be understood and appreciated, a broadband low-noise amplifier is needed in the receiver of an optical transmission system to convert a relatively small photodetector current into a rather large voltage sufficient to drive successive electrical circuits, such as a demultiplexer or a clock-and-data-recovery circuit (CDR). As already noted, in the OEIC such as that shown in FIG. 2, the input power handling is enhanced as a result of the integrated waveguide and distributed HPT gain stages, while the overall gain and broad operating frequency is enhanced through the effect of an integrated broadband traveling InP HPT pre-amplifier on the same OEIC. By delivering an optical signal directly into an intrinsic absorption region of HPT—bypassing the parasitic electrical contact of the base—such an OEIC may advantageously extend the operating frequency while exhibiting less noise than a hybrid combination of a discrete photodiode and HBT amplifier.

Figure 4:
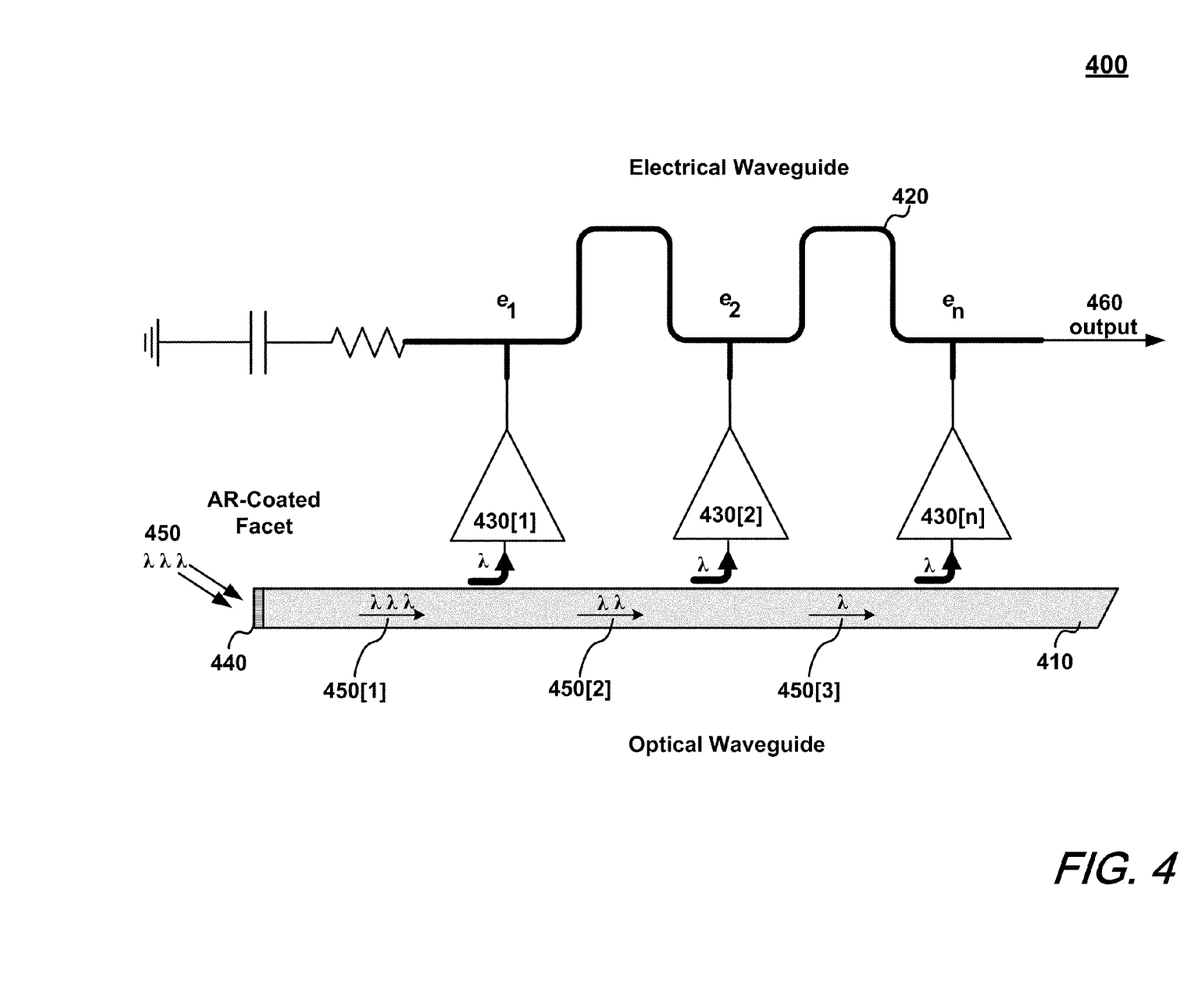
FIG. 4 is a schematic of a single-ended OEIC according to an aspect of the present disclosure.
Figure 5:
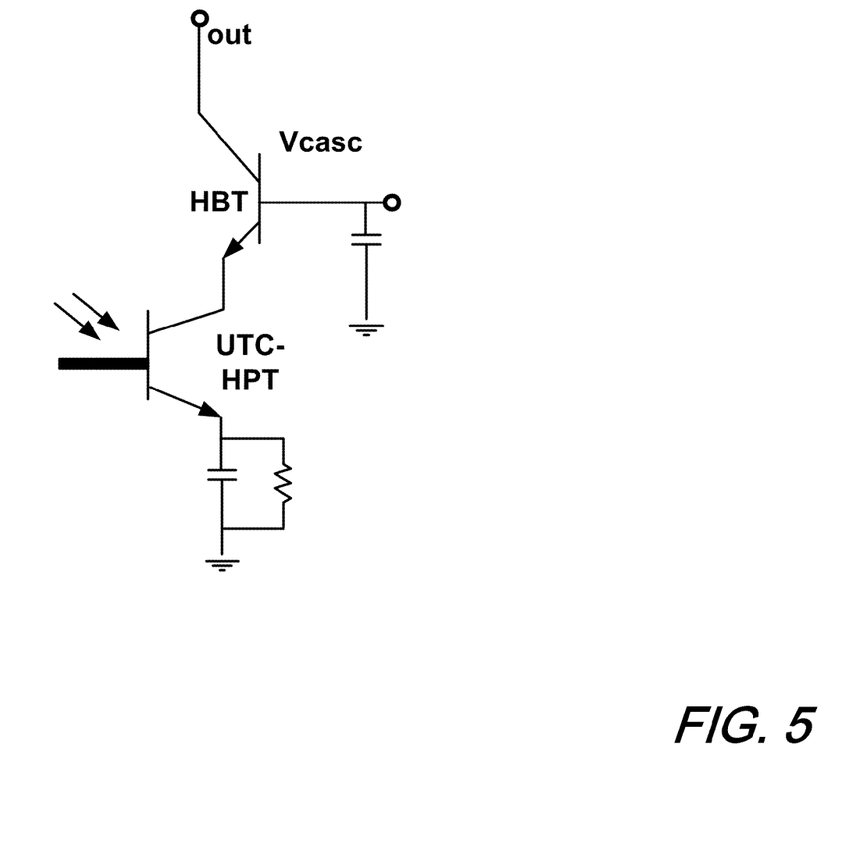
FIG. 5 is a schematic of a single-ended cascade UTC-HPT amplifier stage as employed in the embodiment of FIG. 4.

Turning now to FIG. 4, there is shown a schematic of a representative single-ended, traveling wave UTC-HPT integrated circuit 400. As can be seen from that figure, the circuit 400 generally comprises an optical waveguide 410, an electrical waveguide 420, and a number of HPT-Amplifiers 430[1], 430[2], ..., 430[n], opto-electrically connecting the optical and electrical waveguides. As can be appreciated such HPT-Amplifiers may be single ended UTC-HPT amplifiers of which a representative simple schematic is shown in FIG. 5.

With continued reference to FIG. 4, those skilled in the art will readily appreciate that when optical energy 450 is introduced into the optical waveguide 410 it propagates along that waveguide. Accordingly, upon the introduction of light to an entrance to the waveguide 410—which is shown enhanced by the application of an anti-reflective coating 440 to a face of the entrance—the light so introduced propagates therealong. Accordingly, when a portion of the propagating light 450[1] encounters a first single-ended HPT-Amplifier stage 430[1], an electrical current $e_1$ is produced in the electrical waveguide 420 through the effect of the HPT-amplifier stage 430[1].

Continuing with this discussion of FIG. 4, when a remaining portion of the propagating light 450[2] encounters a second single-ended HPT-Amplifier stage 430[2], an electrical current $e_2$ is produced in the electrical waveguide 420 through the effect of the HPT-amplifier stage 430[2]. Similarly, when a remaining portion of the propagating light 450[n] encounters a final single-ended HPT-Amplifier stage 430[n], an electrical current $e_n$ is produced in the electrical waveguide 420 through the effect of the HPT-amplifier stage 430[n].

One result of this photo-receiver/pre-amplifier architecture—and as can be readily appreciated by those skilled in the art—is that as the propagating light encounters successive HPT-Amplifier stages, a portion of that light is "tapped-off" and results in the production of an electrical current added to that already in the electrical waveguide. Consequently, as the optical signal input to the optical waveguide gets smaller as it traverses the optical waveguide, the electrical output gets (much) larger. Consequently, the bandwidth of a device so constructed exhibits an enhanced bandwidth along with an increase in isolation between input and output.

It is notable that when describing the device shown in FIG. 4, the phase difference of the optical signals propagating therethrough is such that the neighboring output electrical signals add to one another. In this manner, the optical phase is effectively matched to the electrical waveguide.

Figure 6:
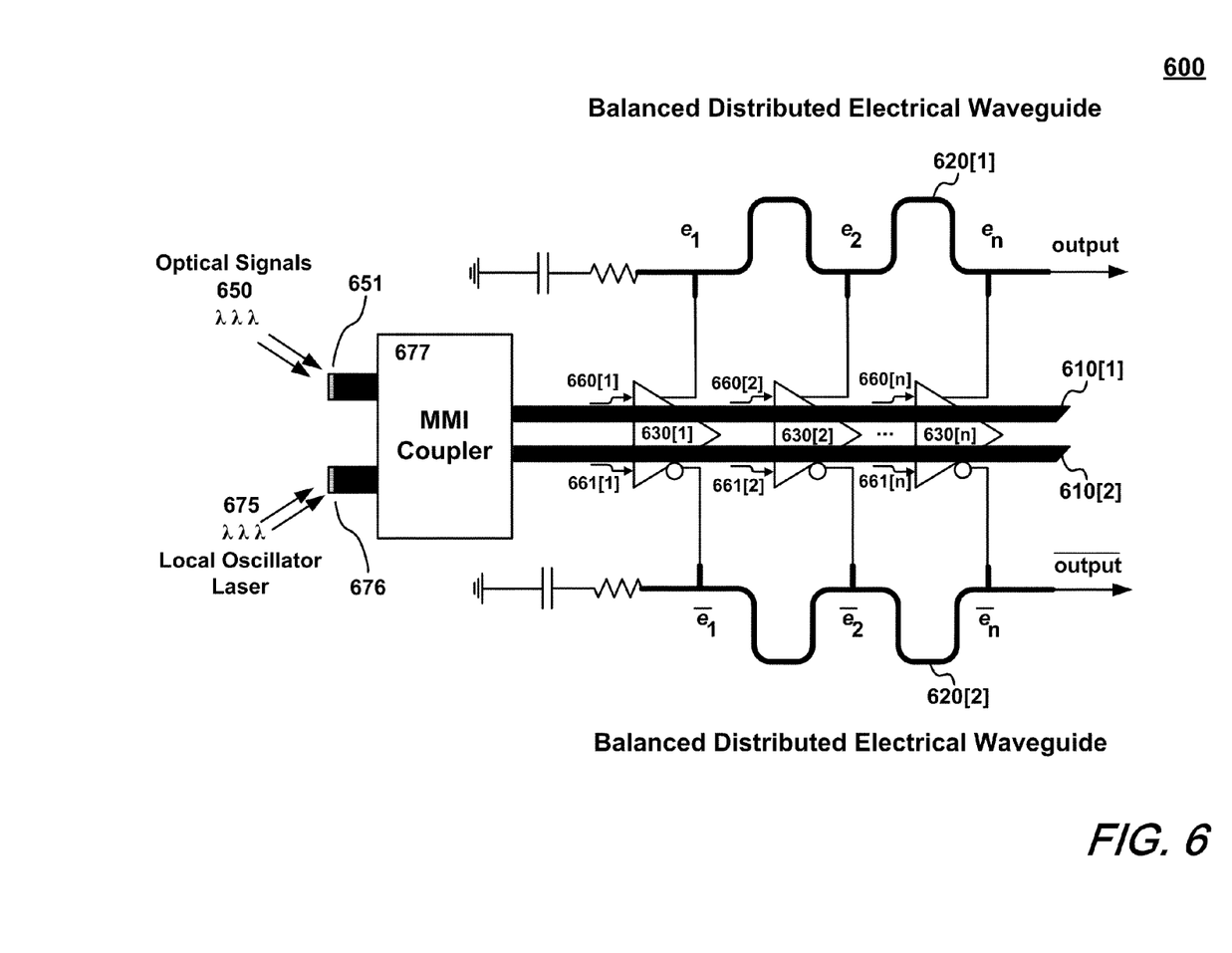
FIG. 6 is a schematic of a balanced traveling wave UTC-HPT OEIC according to an aspect of the present disclosure.
Figure 7:
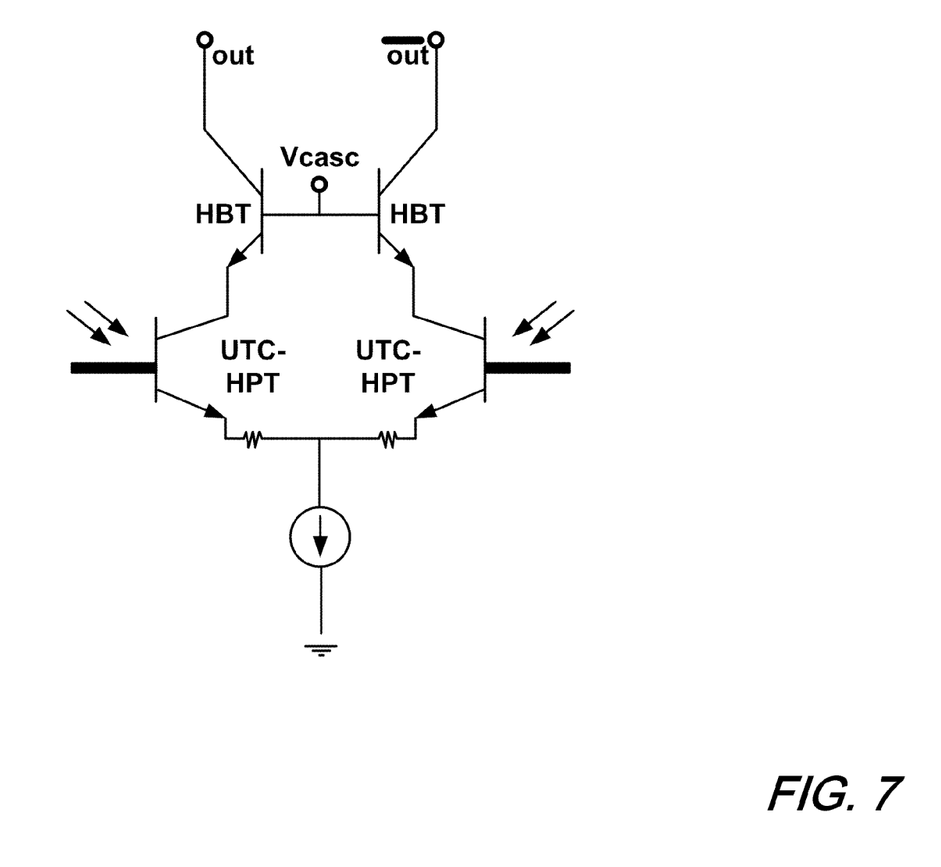
FIG. 7 is a schematic of a differential cascade HPT amplifier stage as employed in the embodiment of FIG. 6.

Turning now to FIG. 6, there is shown a schematic of a balanced traveling wave UTC-HPT receiver 600. More particularly the receiver 600 comprises a pair of optical waveguides 610[1], 610[2] opto-electrically connected to a pair of electrical waveguides 620[1], 620[2] via a number of differential HPT-Amplifiers 630[1], 630[2], ... 630[n]—a representative circuit diagram of which is shown schematically in FIG. 7.

As shown in FIG. 6, optical energy comprising an input optical signal 650 and a local oscillator signal 675 (which may be generated by a laser—not specifically shown) is applied to the inputs of—for example—a multi-mode interference (MMI) coupler 677. As described previously, the input coupling of the applied signals may be enhanced through the effect of one or more anti-reflective coatings 651, 676 applied to surfaces at which the signals are received.

From the MMI coupler 677, the input optical signals (optical signals and local oscillator signals) are directed to the optical waveguides 610[1], 610[2] along which the light signals propagate. Accordingly, when a portion of the propagating light 660[1], 661[1] encounters a first differential HPT-Amplifier stage 630[1], an electrical current $e_1$ is produced in the electrical waveguide 620[1] while an electrical current $\bar{e}_1$ is produced in the electrical waveguide 620[2] through the effect of the HPT-amplifier stage 630[1].

When the remaining portion(s) of the propagating light 660[2], 661[2] encounters a second differential HPT-Amplifier stage 630[2], an electrical current $e_2$ is produced in the electrical waveguide 620[1] while an electrical current $\bar{e}_2$ is produced in the electrical waveguide 620[2] through the effect of the HPT-amplifier stage 630[2]. Similarly, when a further remaining portion of the propagating light 660[n], 661[n] encounters a final differential HPT-Amplifier stage 630[n], an electrical current $e_n$ is produced in the electrical waveguide 620[1] while an electrical current $\bar{e}_2$ is produced in the electrical waveguide 620[2] through the effect of the HPT-amplifier stage 630[n].

Similarly to the case with the single ended device described previously—with the balanced device shown in FIG. 6—as the optical input gets smaller, the electrical output and electrical output (OVERBAR) get (much) larger. As a result, the bandwidth of a device so constructed may exhibit an enhanced bandwidth along with an increase in isolation between input and output.

Figure 8:
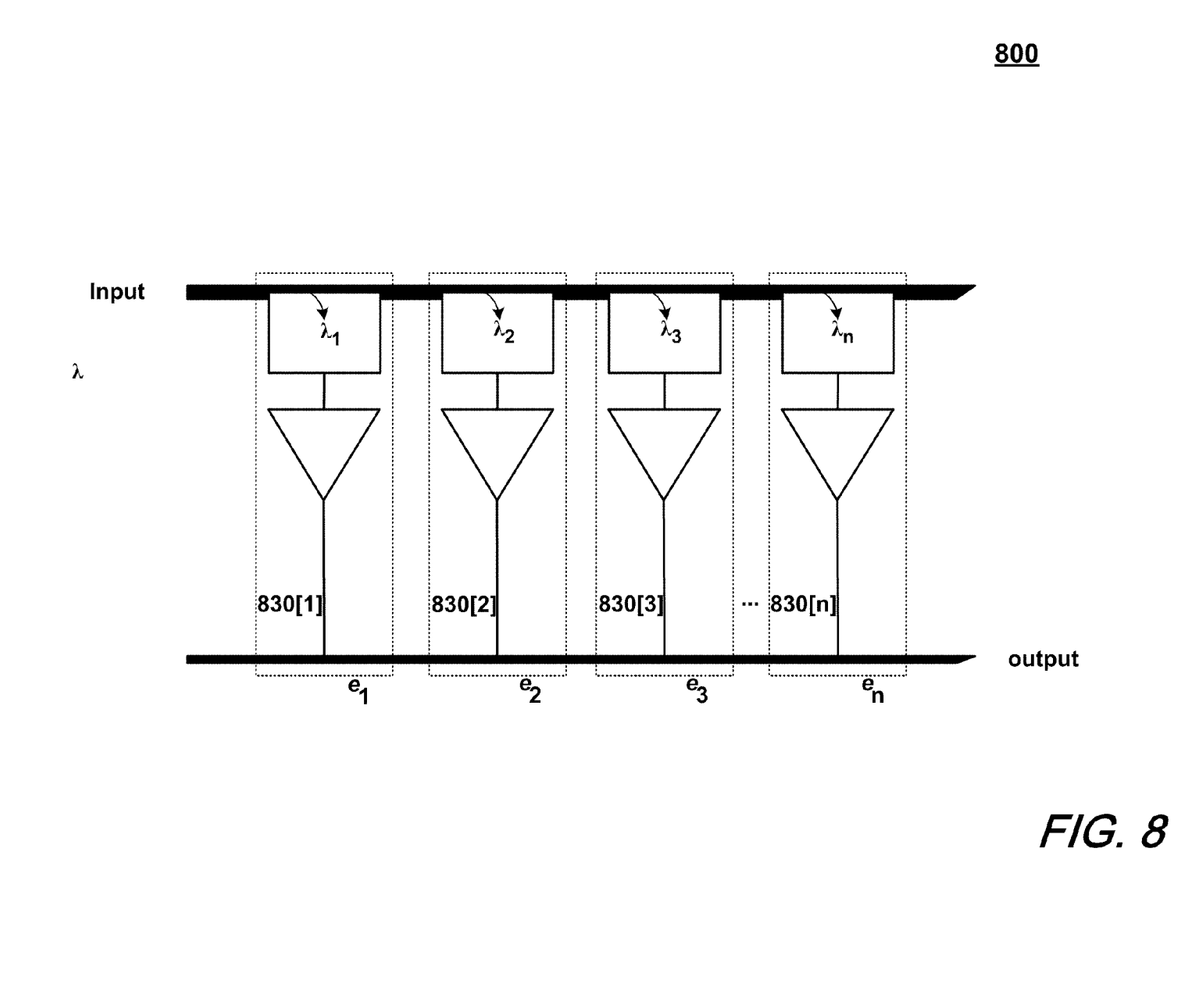
FIG. 8 is a schematic of a simplified multi-wavelength UTC-HPT OEIC according to an aspect of the present disclosure.

Finally turning now to FIG. 8, there it shows a simplified schematic of an additional embodiment of a TW-UTC-HPT OEIC which may advantageously provide a multi-wavelength specificity. More particularly, the OEIC 800 shown in FIG. 8 includes an optical waveguide 810 and an electrical waveguide 820 opto-electrically connected by a plurality of photo-receiver/amplifiers 830[1], 830[1], 830[3], ..., 830[n]. As with prior embodiments, optical signals input to optical waveguide 810 are detected successively by the series of cascaded photo-receivers/amplifiers 830[1], 830[1], 830[3], ..., 830[n]. As discussed previously, the optical signal detected gets smaller as it propagates along the optical waveguide 810, while the electrical output signal gets larger.

Notably, the exemplary configuration shown in FIG. 8 includes photo-receiver/amplifiers (PRA) that are more or less selective to particular wavelengths of light than their neighbors. More particularly, PRA 830[1] is shown selective to $\lambda_1$, while selective PRA's 830[2], 830[3], ..., 830[n] are shown as selective to $\lambda_2, \lambda_3, \ldots \lambda_n$, respectively. Of course, in an actual embodiment the particular selectivity may be ordered/repeated/selected as desired.

At this point, while we have discussed and described the invention using some specific examples, those skilled in the art will recognize that our teachings are not so limited. Accordingly, the invention should be only limited by the scope of the claims attached hereto.

The invention claimed is:

1. An optoelectronic apparatus comprising:
   an optical waveguide;
   an electrical waveguide; and
   a plurality of phototransistor-amplifiers opto-electrically connecting the optical waveguide to the electrical waveguide and positioned such that an electrical output current produced by each is additive to an output current available at the electrical waveguide;
   wherein said phototransistor-amplifiers comprise an emitter region, a base region, a collector region and a subcollector region overlying said optical waveguide which in-turn is disposed upon a substrate; and
   wherein said phototransistor-amplifiers further comprise a tapered transition region for guiding light from the waveguide into the phototransistor.

2. The optoelectronic apparatus of claim 1, wherein the phototransistors-amplifiers are wavelength-specific.

3. The optoelectronic apparatus of claim 1, wherein the phototransistor-amplifiers are optically coupled to the optical waveguide and electrically coupled to the electrical waveguide.

4. The optoelectronic apparatus of claim 1, wherein said optical waveguide is configured to guide optical radiation along a propagation axis therein and said phototransistor-amplifiers are positioned such that they may individually receive a portion of the optical radiation.

5. The optoelectronic apparatus of claim 1, wherein said phototransistor-amplifiers are multi-mode uni-travel carrier heterojunction photo-transistors (MM-UTC-HPTs).

6. A method for receiving an optical signal comprising the steps of:
   receiving the optical signal into an optical waveguide such that it is guided therein;
   detecting a portion of the guided optical signal through the effect of a phototransistor-amplifier optically coupled to the optical waveguide and producing an electrical current in an electrical waveguide in response; and
   detecting a remaining portion of the guided optical signal through the effect of another phototransistor amplifier optically coupled to the optical waveguide and producing additional electrical current in the electrical waveguide in response;
   wherein said electrical currents are combined with one another such that an overall output electrical current is produced which is substantially equal to the sum of all the individual electrical currents produced;
   wherein said phototransistor-amplifiers comprise an emitter region, a base region, a collector region and a subcollector region overlying said optical waveguide which in-turn is disposed upon a substrate; and
   wherein said phototransistor-amplifiers further comprise a tapered transition region for guiding light from the waveguide into the phototransistor.

7. The optical apparatus of claim 6 wherein said phototransistor amplifiers are wavelength specific and the electrical current produced is indicative of a first wavelength component of the optical signal while the additional electrical current produced is indicative of a second wavelength component of the optical signal.

8. The optoelectronic apparatus of claim 6, wherein said phototransistor-amplifiers are multi-mode uni-travel carrier heterojunction photo-transistors (MM-UTC-HPTs).

9. An optoelectronic receiver comprising:
   a substrate;
   a diluted waveguide disposed upon the substrate;
   a plurality of multi-mode uni-travel carrier heterojunction photo-transistors (MM-UTC-HPTs) disposed upon the diluted waveguide and in optical communication with a tapered transition region such that at least a portion of optical energy propagating within the diluted waveguide is directed into the plurality MM-UTC-HPTs resulting in the generation of an electrical current from each of the MM-UTC-HPTs ; and a plurality of amplifiers individually associated with each of the MM-UTC-HPTs which receive and amplify the generated electrical currents.

10. The optoelectronic receiver of claim 9 wherein said phototransistor-amplifiers comprise an emitter region, a base region, a collector region and a subcollector region overlying said waveguide which in-turn is disposed upon the substrate.

11. The optoelectronic receiver of claim 9 wherein said plurality of MM-UTC-HPTs are spaced along the diluted waveguide such that their generated electrical currents are combined into a single output electrical current the magnitude of which is substantially equal to the sum of all of the individual amplified currents.

12. The optoelectronic receiver of claim 11 further comprising:

an electrical waveguide disposed upon the substrate for receiving the generated electrical currents and outputting the combined current.

13. An optoelectronic receiver comprising:
a pair of optical waveguides;
a pair of electrical waveguides;
a plurality of phototransistor-amplifiers optically coupled to the optical waveguides and electrically coupled to the electrical waveguides, said phototransistor-amplifiers being positioned such that an electrical output produced by each is combined into an output current available at the electrical waveguides; and a pair of optical inputs optically coupled to the optical waveguides;

such that upon application of an optical signal to one of the optical inputs and a local oscillator optical signal to the other optical input a current $e$ is output from one of the electrical waveguides and a current $\bar{e}$ is output from the other electrical waveguide;

wherein said phototransistor-amplifiers are multi-mode uni-travel carrier heterojunction photo-transistors (MM-UTC-HPTs).

14. The optoelectronic receiver of claim 13 further comprising:

a multi-mode interference coupler optically coupled to the optical inputs and to the optical waveguides.

15. The optoelectronic receiver of claim 14, wherein said optical waveguides are configured to guide optical radiation therein and said phototransistor-amplifiers are positioned such that they may individually receive a portion of the optical radiation.

\* \* \* \* \*